United States Patent [19]

Patterson

[11] 4,073,381
[45] Feb. 14, 1978

[54] COMPONENT CARRYING

[75] Inventor: William Luther Patterson, Northboro, Mass.

[73] Assignee: Adams-Russell Co., Inc., Waltham, Mass.

[21] Appl. No.: 607,034

[22] Filed: Aug. 22, 1975

[51] Int. Cl.² ............................................. B65D 73/02
[52] U.S. Cl. .................................. 206/331; 220/4 E; 339/17 CF
[58] Field of Search .................. 174/52 FP; 206/328, 206/329, 331, 332; 339/17 CF, 36, 174; 317/101 CC; 220/4 B, 4 E

[56] References Cited

U.S. PATENT DOCUMENTS

| Re. 28,064 | 7/1974 | Venaleck et al. ........... 339/17 CF X |
| 2,792,111 | 5/1957 | Ringler et al. ............... 206/331 X |
| 3,017,602 | 1/1962 | Little .................................. 339/174 |
| 3,176,838 | 4/1965 | Duval ................................ 206/331 |
| 3,297,974 | 1/1967 | Pittman ........................... 339/17 CF |
| 3,417,865 | 12/1968 | Suverkropp et al. ........... 206/331 X |
| 3,604,557 | 9/1971 | Cedrone ......................... 206/331 X |
| 3,652,974 | 3/1972 | Tems .............................. 206/331 X |
| 3,678,385 | 7/1972 | Bruner ....................... 339/17 CF X |

Primary Examiner—Stephen Marcus
Attorney, Agent, or Firm—Charles Hieken

[57] ABSTRACT

A component carrier for supporting a small precision electronic component with fine leads includes a pair of like generally J-shaped thin plates for mating relationship with each other in slightly overlapping relationship to define an opening accommodating the component with a number of parallel channels from the opening to the outside for protectively accommodating the component leads. These channels are formed by a series of partially overlapping staggered openings from opposed sides of the thin surface that define parallel channels between the closely adjacent opposed surfaces that snugly accommodate the component leads.

10 Claims, 6 Drawing Figures

COMPONENT CARRYING

BACKGROUND OF THE INVENTION

The present invention relates in general to component carrying and more particularly concerns novel apparatus and techniques for supporting precision components with fine leads, such as miniature microwave or integrated circuit components, while preventing damage that might otherwise occur. The invention is relatively easy and inexpensive to fabricate and relatively easy to assemble and disassemble by relatively unskilled personnel.

Precision miniature and microminiature components, such as integrated circuits and miniature microwave components, are in packages having fine leads, some leads passing through an insulating bead seated in an opening in a conductive casing. While the component may be carefully tested prior to shipping, damage to the lead or insulating bead during shipment or otherwise before assembly may result in the component being inoperative. The prior art approach to this problem has been shipping components in porous plastic material, such as foam, with the fragile leads embedded in the foam. Despite these precautionary measures a significant number of components become damaged prior to installation.

Accordingly, it is an important object of this invention to provide improved methods and means for carrying precision components.

It is another object of the invention to achieve the preceding object while minimizing damage to precision components during transit.

It is a further object of the invention to achieve one or more of the preceding objects with apparatus that is relatively inexpensive to fabricate, is relatively lightweight and occupies relatively little space while affording good protection.

It is a further object of the invention to achieve one or more of the preceding objects with apparatus that is relatively easy to assemble around a precision component to be protected by relatively unskilled person prior to shipment and to disassemble by relatively unskilled personnel immediately prior to use of the component.

SUMMARY OF THE INVENTION

According to the invention, a component carrier comprises means defining first and second opposed surfaces separated by a distance slightly greater than the lead thickness of the component to be protected for protecting a lead in a region between the surfaces and having at least one lead protecting channel formed by staggered partially overlapping recesses extending from each of the surfaces toward but not through the other to define an opening orthogonal to the axis of the recesses for accommodating a thin lead. Preferably, there are a plurality of generally parallel lead channels formed in this manner. A preferred form of the invention comprises like pieces that snap together around a component to be protected that define an opening for snugly accommodating the component upon which the recesses terminate for accommodating the leads. In a more specific form of the invention the pieces are generally J-shaped and have a tongue-and-groove constructional arrangement whereby the short stem of one piece fits inside and adjacent to the short stem of the other.

Numerous other features, objects and advantages of the invention will become apparent from the following specification when read in connection with the accompanying drawing in which:

DETAILED DESCRIPTION OF PREFERRED EMBODIMENTS

Figure 1:
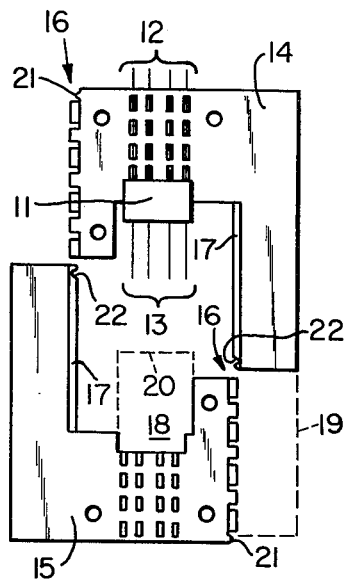
FIG. 1 is a perspective exploded view of an embodiment of the invention supporting a precision miniature component with fine leads according to the invention.

With reference now to the drawing and more particularly FIG. 1 thereof, there is shown an exploded view of a carrier according to the invention for accommodating a precision miniature component 11 having fragile leads such as leads 12 and leads 13 with leads 12 shown seated in member 14 that is identical to member 15 when the groove formed by the alternating tabs 16 mate with the tongue 17 and each bump 21 mates with a matching recess 22 the broken lines 20 and 19 indicate the positions of portions of member 14 when mated together with member 15 to define a component opening 18 with the dimension of the component opening in the direction along the length of the lead channels being greater than the dimension of a component to be carried along the direction of the component leads whereby the component may be carried by the apparatus with the component centered in the component opening so that there is a gap between the component and the bight portions of the J-shaped members 14 and 15.

Figure 2:
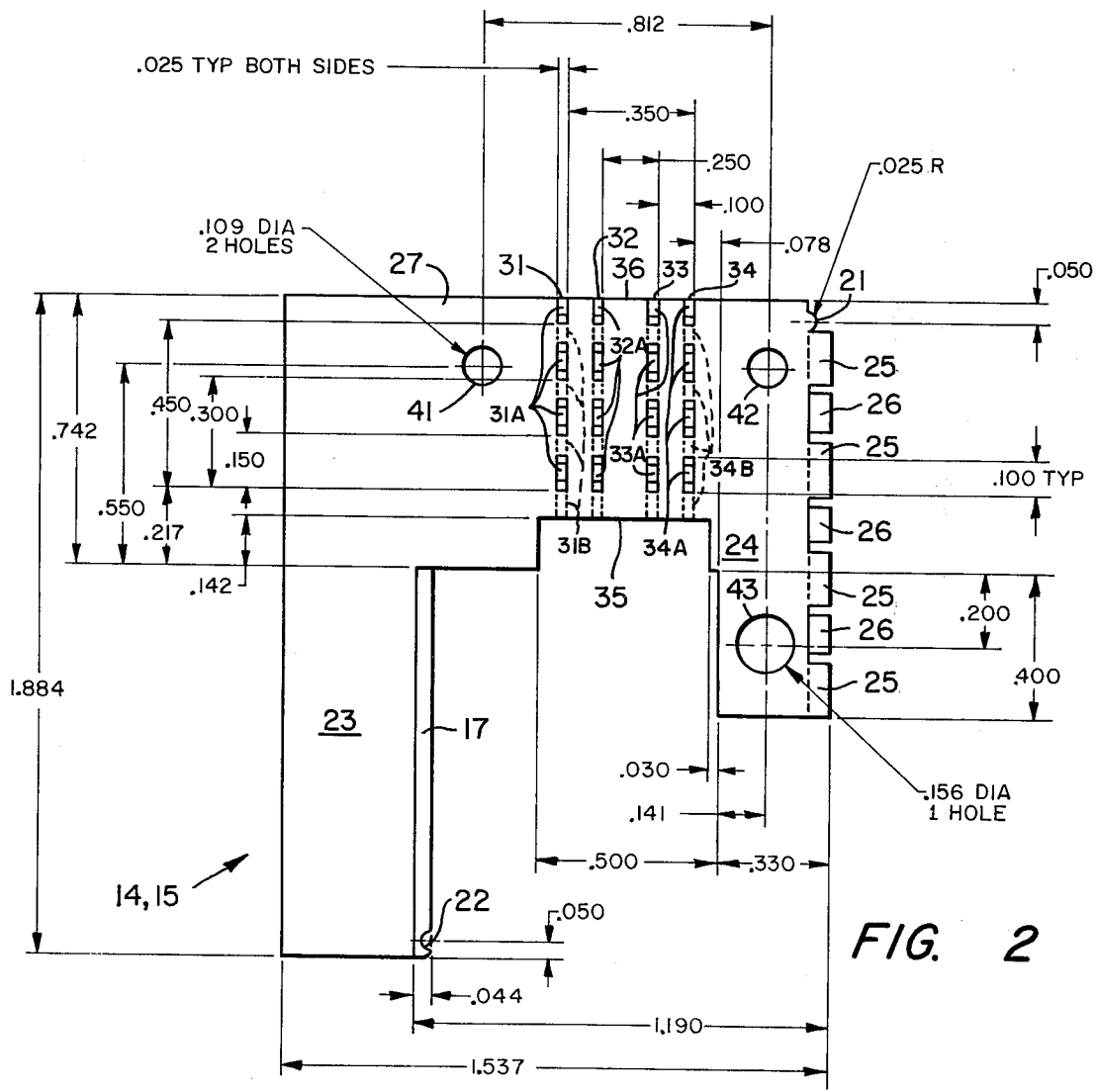
FIG. 2 is a plan view of one side of the piece according to the invention.

Referring to FIG. 2, there is shown a plan view of like pieces 14, 15 of generally J-shape having a long stem portion 23 carrying tongue 17 formed with recess 22 and a short stem 24 forming a groove for accommodating tongue 17 of a like piece by the tabs 25 extending from the visible surface and the staggered tabs 26 extending from the hidden surface.

The cap portion 27 is formed with four lead channels 31, 32, 33 and 34 extending parallel to each other and the plane of members 14, 15 from the inside edge 35 to the outside edge 36 of a length slightly less than that of the leads of the component to be carried to permit convenient electrical testing of a component ready for shipment. The lead channels are formed by the A recesses 31A, 32A, 33A, 34A that are visible and the partially overlapping B recesses 31B, 32B, 33B, 34B extending in from the hidden surface (visible in FIG. 4) whose central portions are hidden in FIG. 2 to form the channels as best seen in FIG. 5.

Figure 3:
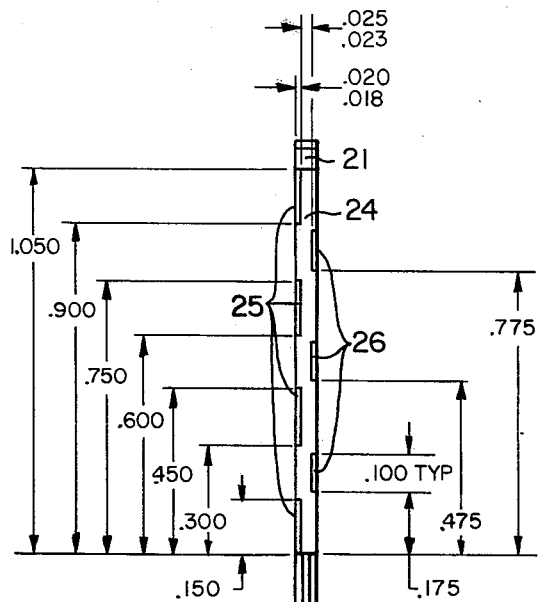
FIG. 3 is a side view of the embodiment of FIG. 2 facing the right side of the embodiment of FIG. 2 and the left side of the plan view of FIG. 4 which shows the embodiment of FIG. 2 turned over.
Figure 6:
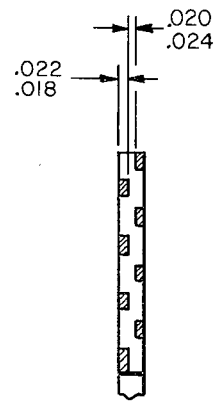
FIG. 6 is a sectional view through section 6—6 of FIG. 4 illustrating how the staggered recesses on opposite sides of the member present a clear lead channel perpendicular to the axis of the staggered recesses.
Figure 4:
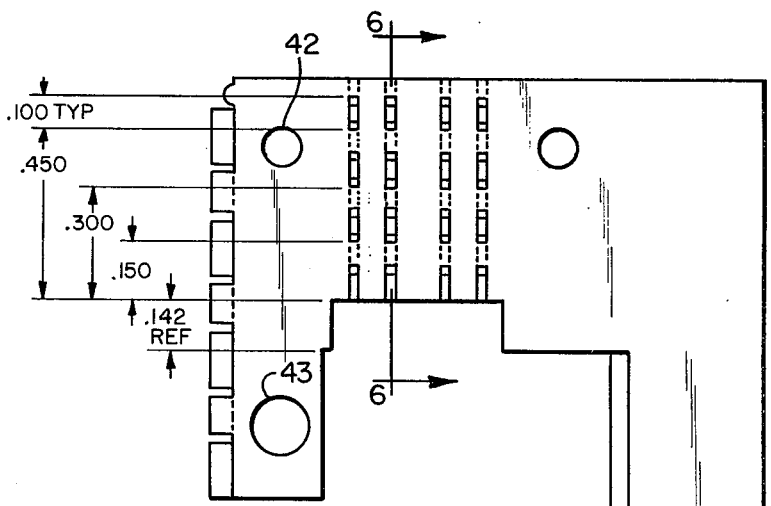
Figure 5:
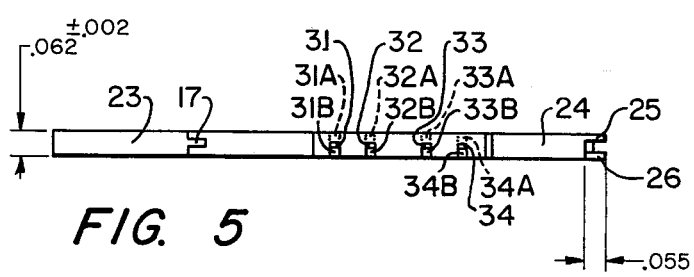
FIG. 5 is a bottom view of the embodiment of FIG. 2.

FIG. 3 is a side view of the embodiment of FIG. 2, FIG. 4 is a plan view as seen from the other side, FIG. 5 is a bottom view and FIG. 6 is a sectional view through section 6—6 of FIG. 4. The same reference symbols identify corresponding elements throughout the drawing. The specific dimensions are those of a specific embodiment of the invention for accommodating a precision miniature microwave component ⅜ × ½

× 3/32 inch having four leads extending from each long side of diameter slightly less than 0.020 inches. The material is preferably 30% glass-filled nylon having a black temperature capability of 254° C. with dielectric strength 480 volts per mil on ⅛ inch thick sample with a dielectric constant of 4.0 to 4.4 to meet military specifications. Other materials may be used.

For reasons of economy it is preferred that the parts be molded. However, the A and B recesses may be formed by drilling, milling or other suitable techniques. The recesses should be deep enough and of large enough area so that they partially overlap to provide a clear lead channel in the member generally parallel to the plane of the member but should preferably not pass entirely through the member. There is preferably sufficient material surrounding each recess to provide adequate strength. The difference in penetration depth of the staggered recesses preferably corresponds to a distance that is slightly greater than the thickness of the lead to be accommodated to snugly accommodate the lead while being large enough to facilitate easy insertion.

In the preferred form of the invention illustrated the lead channels extend through from inside to outside; however, it is within the principles of the invention to have the channels not extend through and to be curved instead of straight as shown. It is also within the principles of the invention to use different materials, different forms, to make the invention in one or more pieces and of different shapes. The circular openings 41, 42 and 43 in the members permit them to fit over pins in a carrying case or to be stacked on pins for safely shipping a large number of components, or for fitting on a test jig.

The invention has a number of advantages. FIG. 1 shows the lead ends extending beyond the carrier. In a preferred form of the invention component 11 is seated with the lead ends entirely within the carrier so that there is a gap between the component body and the carrier. An advantage of this arrangement is that the leads are free from stresses where seated in glass beads in the component, an especially advantageous feature when the leads are not perfectly centered in the glass beads as often occurs in production. Still another advantage is that the exposed portions of the leads may readily be engaged by test clips for making electrical tests of the component while being protected in the carrier.

Still another feature of the invention is that the case with leads attached may be positioned in the carrier with the case top open. The carrier may then function to support the case while connecting circuit elements to the leads inside the case, electrically testing for proper operation before the cover closes the case and then welding the cover plate to the case, thereby minimizing lead breakage during assembly and testing of the component.

While the specific embodiment of the invention is shown with the longitudinal openings symmetrical and the carrier thickness less than the component thickness, it is within the principles of the invention to position the lead channels asymmetrically in the carrier so that one side of the component case is on the inside of the plane including the carrier surface. The carrier may then serve as a support for the component and rest upon a table or other work surface which the component itself does not contact. Alternatively, the carrier thickness may be made greater than that of the component.

There has been described novel apparatus and techniques for carrying precision components while minimizing transport damage. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Component carrying apparatus comprising,
    means defining a thin member of thickness between opposed exterior surfaces much less than its length or width for accommodating lead channels in which component leads may be inserted for protection and including means defining said lead channels,
    said lead channels being defined by a series of partially overlapping recesses extending into the interior of said member from said opposed exterior surfaces.

2. Component carrying apparatus in accordance with claim 1 wherein said means comprises a generally J-shaped member with a cap portion interconnecting long and short stem portions having said recesses in the cap portion and having the inside of the long stem portion and the outside of the short stem portion formed with one of a tongue and groove for mating relationship with the short and long stem portions respectively of a like member to form an opening for accommodating a precision component to be carried whose leads may extend into the lead channels in the cap portion.

3. Component carrying apparatus in accordance with claim 2 wherein said lead channels extend entirely through the cap portion.

4. Component carrying apparatus in accordance with claim 3 wherein said recesses are rectangular openings.

5. Component carrying apparatus in accordance with claim 4 wherein said lead channels are parallel to each other.

6. Component carrying apparatus in accordance with claim 2 and further comprising a second of said generally J-shaped members in mating relationship with said first-mentioned generally J-shaped member.

7. Component carrying apparatus in accordance with claim 6 wherein said first-mentioned and second generally J-shaped members in mating relationship surround a component opening with the dimension of said component opening in the direction along the length of said lead channels greater than the dimension of a component to be carried along the direction of the component leads whereby the component may be carried by said apparatus with the component centered in said component opening so that there is a gap between the component and the bight portions of said J-shaped members.

8. Component carrying apparatus in accordance with claim 7 wherein the dimension of said apparatus with said first-mentioned and second J-shaped members in mating relationship is longer than the length spanned by the component to be carried and its leads from one group of lead ends to the other group of lead ends so that both groups of lead ends may be carried entirely within said lead channels.

9. Component carrying apparatus in accordance with claim 2 and further comprising, means defining one of a protrusion and recess on the inside of the long stem portion and the other of a protrusion and a recess on the outside of the short stem portion for mating engagement to detachably secure said member to a like member.

10. Component carrying apparatus in accordance with claim 9 and further comprising a second said J-shaped member in mating relationship with said first-mentioned J-shaped member with said protrusion of each seated in said recess of the other.

* * * * *